(12) United States Patent
Mastrangeli et al.

(10) Patent No.: US 8,399,986 B2
(45) Date of Patent: Mar. 19, 2013

(54) METHOD FOR PERFORMING PARALLEL STOCHASTIC ASSEMBLY

(75) Inventors: Massimo Mastrangeli, Vigananello (IT); Caroline Whelan, Hanret (BE); Wouter Ruythooren, Herent (BE)

(73) Assignees: IMEC, Leuven (BE); Katholieke Universiteit Leuven, Leuven (BE)

( * ) Notice: Subject to any disclaimer, the term of this patent is extended or adjusted under 35 U.S.C. 154(b) by 41 days.

(21) Appl. No.: 13/072,558

(22) Filed: Mar. 25, 2011

(65) Prior Publication Data
US 2011/0233791 A1 Sep. 29, 2011

Related U.S. Application Data

(63) Continuation of application No. PCT/EP2009/062469, filed on Sep. 25, 2009.

(60) Provisional application No. 61/100,640, filed on Sep. 26, 2008.

(51) Int. Cl.
*H01L 23/34* (2006.01)
*H01L 21/00* (2006.01)
*H05K 3/20* (2006.01)

(52) U.S. Cl. ......... 257/723; 257/E21.599; 257/E21.602; 438/28; 438/107; 29/831; 29/833; 29/834

(58) Field of Classification Search .................. 257/723, 257/E21.599, E21.602; 438/107; 29/739, 29/740, 831, 833, 834
See application file for complete search history.

(56) References Cited

U.S. PATENT DOCUMENTS
7,018,867 B2 * 3/2006 Gracias .......................... 438/110
7,629,026 B2 * 12/2009 Sharma et al. ................ 427/256
2008/0026505 A1 1/2008 Chakrapani
2009/0265929 A1 10/2009 Nakagawa et al.

FOREIGN PATENT DOCUMENTS
WO WO 2007/037381 4/2007

OTHER PUBLICATIONS

Athanassiou et al. Photocontrolled variations in the wetting capability of photochromic polymers enhanced by surface nanostructuring; Langmuir; vol. 22, No. 5; (2006) pp. 2329-2333.
Balakrishnan, et al., Self Assembly of Microcomponents on Patterned Substrate Using Capillary Force, *IEEE Electronics Packaging Technology Conference*, 2005, pp. 148-152.
Bohringer, Karl; Surface Modification and Modulation in Microstructures: controlling protein adsorption, monolayer desorption and micro-self-assembly; *Journal of Micromechanics and Microengineering*, Jun. 13, 2003, vol. 13, pp. S1-S10.
Chang et al, Self-Assembly of Microchips on Substrates, *Electronic Components and Technology Conference*, 2006, pp. 1533-1538.
Delorme et al, Azobenzene-containing monolayer with photoswitchable wettability, Langmuir vol. 21, No. 26, pp. 12278-12282, 2005.
Gras et al, Intelligent Control of Surface Hydrophobicity, *ChemPhysChem*, 2007, vol. 8, pp. 2036-2050.

(Continued)

*Primary Examiner* — Jasmine Clark
(74) *Attorney, Agent, or Firm* — Knobbe Martens Olson & Bear LLP

(57) ABSTRACT

A method of positioning at least 2 chips simultaneously on a substrate by parallel stochastic assembly in a first liquid is disclosed. In one aspect, the chips are directed to target sites on the substrate within the first liquid. The target sites are covered with a second liquid. The second liquid and the first liquid are immiscible. The chips are attracting the first liquid. A predetermined surface is chosen or treated on each chip such that it is selectively attracted by the second liquid and attracting the first liquid.

28 Claims, 2 Drawing Sheets

OTHER PUBLICATIONS

Gutmann, V., Solvent effects on the reactivities of organometallic compounds, Coordination Chemistry Reviews, 18: 225-255, 1976.

Ichimura et al, Light-driven motion of liquids on a photoresponsive surface, Science, vol. 288, Jun. 2, 2000, pp. 1624-1626.

Berná et al, Macroscopic transport by synthetic molecular machines, Nature Materials, vol. 4, Sep. 2005, pp. 704-710.

Kosower, E.M., An Introduction to Physical Organic Chemistry—Section 2.6—Solvent Polarity: Empirical Measures, Wiley, New York, 1969, pp. 293-316.

Leigh et al, Catenane Chameleons: Environment-Sensitive Translational Isomerism in Amphiphilic Benzylic Amide [2]Catenanes, *Angew. Chem. Int. Ed. Engl.* 1996, vol. 35 No. 3, VCH Verlagsgesellschaft, Weinheim, pp. 306-310.

Meyer et al, Recent Progress in Understanding Hydrophobic Interactions, *Proceedings of the National Academy of Sciences (PNAS)*, Oct. 24, 2006, vol. 103 No. 43, pp. 15739-15746.

PCT International Search Report and Written Opinion as mailed May 11, 2010 in international application No. PCT/EP2009/062469 filed Sep. 25, 2009.

Radüge et al, Controlling wettability by light: illuminating the molecular mechanism, The European Physical Journal E, vol. 10 (2003) pp. 103-114.

Scott et al, High-Performance Inductors Using Capillary Based Fluidic Self-Assembly, *Journal of Microelectromechanical Systems*, Apr. 2004, vol. 13 No. 2, pp. 300-309.

Srinivasan et al, Microstructure to Substrate Self-Assembly Using Capillary Forces, *Journal of Microelectromechanical Systems*, Mar. 2001, vol. 10 No. 1, pp. 17-24.

Stauth et al, Self-assembled Single-Crystal Silicon Circuits on Plastic, *Proceedings of the National Academy of Sciences (PNAS)*, Sep. 19, 2006, vol. 103 No. 38, pp. 13922-13927.

Verma et al, Fluidic Self-Assembly of Silicon Microstructures, *IEEE*, 1995, pp. 1263-1268.

Vlassiouk et al, Control of nanopore wetting by a photochromic spiropyran: a light-controlled valve and electrical switch, Nano Letters, vol. 6, No. 5, (2006) pp. 1013-1017.

* cited by examiner

METHOD FOR PERFORMING PARALLEL STOCHASTIC ASSEMBLY

CROSS REFERENCE TO RELATED APPLICATIONS

This application is a continuation of PCT Application No. PCT/EP2009/062469, filed on Sep. 25, 2009, which claims priority under 35 U.S.C. §119(e) to U.S. provisional patent application 61/100,640 filed on Sep. 26, 2008. Each of the above applications is incorporated herein by reference in its entirety.

BACKGROUND OF THE INVENTION

1. Field of the Invention

The disclosed technology relates to the fields of hybrid assembly of microsystems, parallel stochastic assembly and 3D electronics integration.

2. Description of the Related Technology

Flip-chip is presently the most common technique used to build up heterogeneous electronic systems. It includes mechanically picking up the individual components (i.e. devices, in the following equivalently referred as chips or parts) of the system, moving them to their final location in the system (e.g. on a common planar substrate), and finally mechanically and electrically binding them in place.

In the perspective of device downscaling and improved assembly throughput, such technique presents some problems: it is serial; it requires closed-loop external control and direct contact of the handling tool with the involved parts.

Fluid-mediated parallel stochastic assembly (also known as capillary-driven self-assembly) is a promising alternative to flip-chip which potentially overcomes its issued shortcomings. In its essence, it exploits the substrate as a template to organize the parts and to drive them into correct placement. The assembly takes place in a liquid environment, which allows avoiding direct handling of the individual parts, while they can be processed in parallel.

In A. K. Verma, M. A. Hadley, H.-J. J. Yeh, J. S. Smith, "Fluidic self-assembly of silicon microstructures," *Proceedings of 45$^{th}$ Electronic Components and Technology Conference*, (1995), 1263-1268., cavities etched into the planar substrate are exploited, whose tri-dimensional geometry allows for chips of complementary shapes to match and selectively fit therein (driven by gravity) as they are spread over the substrate in a fluid medium. In S. A. Stauth and B. A. Parviz, "Self-assembled single-crystal silicon circuits on plastic", *PNAS* vol. 103, p. 13922-13927 (2006), the use of the grooves, which are realized in a thick resist layer above the substrate, for part placement is combined with the use of molten-solder capillary forces for their binding.

In U. Srinivasan, D. Liepmann and R. T. Howe, "Microstructure to substrate self-assembly using capillary forces", *IEEE JMEMS* vol. 10, p. 17-21 (2001), and K. L. Scott et al., "High-performance inductors using capillary based self-assembly", *IEEE JMEMS* vol. 13, p. 300-309 (2004), two-dimensional shape matching and capillary forces for chip self-alignment are used. A hydrophilic planar substrate is lithographically patterned with purposely-designed binding sites which are treated to be hydrophobic (e.g. by applying a self-assembling monolayer). The chips to be assembled are also similarly treated so to make their functional side (i.e. the one exposing the electrical connections) hydrophobic while leaving the remaining sides hydrophilic. During the assembly process, the binding sites on the substrate are selectively coated with a thin hydrophobic liquid film and subsequently submerged in a hosting aqueous fluid; this is required since the interface between the hydrophobic film and the hosting fluid has to be highly energetic. The chips to be assembled are then directed toward the substrate. Upon contact between the hydrophobic film on the binding sites and the hydrophobic side of the chips, the (interfacial) energy of the system is lowered, and this energy minimization (capillarity) induces a force on the chips which drives them into alignment with the underlying binding sites. The alignment performance and accuracy achievable depends on several parameters, mainly on the design of the sites and the chips, on the energy of the fluid interface and on the volume of the hydrophobic film deposited on the sites.

In fluidic assembly techniques according to the prior art, use is made of the interfacial energy between the aqueous hosting fluid (typically, water) and the hydrophobic fluid (typically, a hydrocarbon oil or polymer) to drive the assembly of chips. On the other hand, the chips themselves have their functional side made hydrophobic, and they are also immersed in the hosting fluid at the time of assembly.

Depending on the way the chips are delivered toward the substrate and on the way they move across it to search for the binding sites, the chance that they get into close vicinity is high. Hydrophobic surfaces immersed in aqueous fluids experience the so-called hydrophobic interaction, which tends to draw the surfaces in close contact. It is found that this has the effect of getting the chips to stick to each other. Such mutual binding is most likely pair-wise, and involves the functional side of the chips, which is thus hidden from exposure. The interaction force is relatively high; practically, once the chips are stuck they can no longer be detached, unless immersed in a fluid of lower surface tension [illustrated in FIG. 1] (but using such fluid for the assembly would also decrease the force driving the assembly itself). As a consequence, they can no longer be used for assembly purposes. Moreover, bubbles that may accidentally be produced in the hosting fluid may also easily interact with the hydrophobic surface of the chips: in this eventuality, aggregates involving more than two chips may form. It constitutes an undesired effect in these 2D assembly processes. The main consequence of such interference is evidently a reduction in process yield: chips that get stuck during delivery cannot be used for assembly, nor can they be recycled to be used in subsequent assembly steps. Equivalently, since a certain fraction of the chips may get involved in mutual adhesion, the quantity of chips required to achieve the complete assembly over the substrate needs to be larger than ideal, and this makes the process less efficient. The process is also sensitive to bubble formation.

SUMMARY OF CERTAIN INVENTIVE ASPECTS

Certain inventive aspects relate to apparatus and methods for positioning at least two chips on target sites of a substrate wherein the introduction is performed in a recipient in such a way that two or more of the at least two chips are simultaneously present in the recipient before one of the two or more chips contacts one of the target site.

One inventive aspect relates to a method, a chip for use in a capillarity-driven fluidic self-assembly process and a system for positioning at least two chips on a substrate.

In a first aspect, the present disclosure relates to a method of positioning at least two chips (1) at target sites present on a substrate comprising the step of introducing at least two chips in a recipient wherein the introduction is performed in such a way that two or more of the at least two chips are simultaneously present in the recipient before one of the two or more chips contacts one of the target sites.

In one aspect, there is to a method of positioning at least 2 chips (i.e. dies) simultaneously on a substrate by parallel stochastic assembly in a first liquid, wherein the chips are directed to target sites within the first liquid, the target sites being covered with a second liquid, the second liquid and the first liquid being immiscible, wherein the chips are attracting the first liquid, and on each chip a predetermined surface is chosen or treated such that it is selectively attracted by the second liquid and/or attracting the first liquid. For instance, the predetermined surface may be chosen or treated such that it is capable of changing its polarity in function of the presence of one or more chemical and/or physical stimuli and thereby be attracted by the second liquid in presence (or absence) of one or more such stimuli and attracting the first fluid in absence (or presence) of one or more such stimuli.

In embodiments of the first aspect, the predetermined surface may start repelling the first liquid when brought in contact with the second liquid, to which it is selectively attracted.

In embodiments of the first aspect, the first liquid and the second liquid may have a polar character and an apolar character respectively, or an apolar and polar character respectively.

In embodiments of the first aspect, the first liquid may comprise water or consist substantially of water or consist of water.

In embodiments of the first aspect, the first liquid may further comprise glycerol or ethylene alcohol.

In embodiments of the first aspect, the second liquid may comprise fluorocarbon oil or hydrocarbon oil or hydrophobic polymers.

In embodiments of the first aspect, repelling may correspond to having a hydrophobic character and attracting corresponds to having a hydrophilic character.

In embodiments of the first aspect, the predetermined surface may be a first main surface of the chips.

In embodiments of the first aspect, the predetermined surface of the chips may be the surface comprising electrical interconnections, e.g. the side of the chip comprising the BEOL.

In embodiments of the first aspect, the chips may be silicon chips. They can be of any material, given that the functional side can still be chemically treated as described, and that the other sides are attracting the first liquid (e.g. hydrophilic). Silicon is therefore only one of possible materials. In embodiments of the first aspect, the predetermined main surface of the chips may comprise catenanes, rotaxanes, nanomills and other switching molecular motors and macromolecules.

In embodiments of the first aspect, the catenanes may be attached to the predetermined surfaces by self-assembling monolayers (SAMs).

In embodiments of the first aspect, the SAMs may be stable at temperatures below about 500° C., below about 400° C., below about 300° C., below about 200° C., below about 100° C., or below about 50° C., or at room temperature (about 25° C.), or below room temperature.

In embodiments of the first aspect, the predetermined surface may comprise a thin, first liquid-attracting layer which dissolves in the second liquid when in contact with the second liquid.

In embodiments of the first aspect, the target sites and first main surface of chips may be patterned such that the chips are automatically oriented on the substrate.

In embodiments of the first aspect, at least one target site (5) may have a size and shape which correspond to a size and shape of at least one of the introduced chips (1) and/or has a pattern which correspond to a pattern present on at least one of the introduced chips (1), so as to favor a certain orientation of the at least one of the introduced chips (1) on the at least one target site.

In embodiments of the first aspect, the recipient may comprise a first volume (10) and a second volume (11), the first volume being relatively closer to the substrate (6) than the second volume and the first volume (10) or the second volume being illuminated with a first light for switching the polarity of a chip described above while the second volume (11) or the first volume being less illuminated than the first volume (10) or being not illuminated with the light or being illuminated with a second light for reversing the polarity switch occurred by the first light respectively.

In embodiments of the first aspect, a temperature gradient may be present in the recipient so that the temperature close to the substrate (6) is different from the temperature away from the substrate (6).

In embodiments of the first aspect, the method may further comprise the step of removing the substrate (6) and the chip (1) from the first liquid.

In embodiments of the first aspect, the method may further comprise the step of heating the substrate (6), thereby causing a fine alignment of electrical contacts on the chips (1) and substrate (6), and causing bonding of such electrical contacts into electrical interconnects between chip (1) and substrate (6).

In embodiments of the first aspect, the method may further comprise removing the substrate and the chip from the first liquid.

A method according to the above further comprising heating the substrate, hereby causing a fine alignment of electrical contacts on the chips and substrate, and causing bonding of such electrical contacts into electrical interconnects between chip and substrate.

In a second aspect, the present disclosure relates to a chip (1) for use in a capillarity-driven fluidic self-assembly process comprising at least one external surface (2), wherein at least part of the external surface (2) is capable of changing its polarity in function of the presence of one or more chemical and/or physical stimuli.

In embodiments of the second aspect, the change in polarity can be switching from an hydrophilic to an hydrophobic character or from an hydrophobic to an hydrophilic character. At least one of the chemical stimuli may be the polarity of a liquid media contacting the part of the surface (2) and wherein the part of the surface is capable of switching between an hydrophilic character when in contact with an hydrophilic liquid and a hydrophobic character when in contact with an hydrophobic liquid (3). At least one of the physical stimuli may be light in a predefined wavelength range or a temperature in a predefined temperature range. Furthermore, the change in polarity in function of the presence of one or more chemical and/or physical stimuli may be reversible.

In embodiments of the second aspect, the surface (2) may comprise electrical contacts for making interconnections with a substrate (6) comprising corresponding contacts.

In further embodiments of the second aspect, the part of the surface (2) may have catenanes bonded to it, and the hydrophilic character may be conferred by at least one hydrophilic macrocycle of the catenanes and the hydrophobic character may be conferred by at least one hydrophobic macrocycle of the catenanes. The part of the surface (2) can bear catenanes bonded to it, and the hydrophilic character may be conferred by at least one hydrophilic section of at least one amphiphilic macrocycle of the catenanes and the hydrophobic character may be conferred by at least one hydrophobic section of at least one amphiphilic macrocycle of the catenanes. The catenanes may be attached to part of the surface (2) by a self assembling monolayer. The catenanes may also be attached covalently to the part of the surface (2).

In further embodiments of the second aspect, part of the surface (2) may be bonded to a polymer having a lower critical solution temperature. Such a polymer is a N-alkylacrylamide or a N-alkylmethacrylamide polymer or copolymer with poly(N-isopropylacrylamide) being preferred.

In a further embodiment of the second aspect, the chip is a silicon chip.

In a third aspect, the present disclosure relates to a system for positioning at least two chips (1) on a substrate (6), the system comprising a recipient (7) having a first volume (10) and a second volume (11), the first volume (10) being relatively closer to the bottom (8) of the recipient (7) than the second volume (11), the system further comprising a stimulus unit configured to impose a first physical stimulus to the first volume or the second volume while the second volume or the first volume respectively are not exposed to the first stimulus, are less exposed to the first stimulus or are exposed to a second stimulus different from the first stimulus.

In an embodiment of the third aspect, the stimulus unit may comprise a first light source (9) adapted for illuminating the first volume (10) or the second volume with a first light while keeping the second volume (11) or the first volume less illuminated with the first light than the first volume (10), being not illuminated with the first light or being illuminated with a second light, different from the first light, respectively.

In a further embodiment of the third aspect, the system may comprise means for illuminating the first volume of the recipient in a first range of wavelength and/or means for illuminating with another range of wavelength the second volume of the recipient and/or means for cooling down the first volume or the second volume of the recipient and/or means for heating up the second volume of the first volume of the recipient respectively. Certain inventive aspects are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable and reliable devices of this nature.

The above and other characteristics, features and advantages of the present disclosure will become apparent from the following detailed description, taken in conjunction with the accompanying drawings, which illustrate, by way of example, the principles of the disclosure. This description is given for the sake of example only, without limiting the scope of the disclosure. The reference figures quoted below refer to the attached drawings.

DETAILED DESCRIPTION OF CERTAIN ILLUSTRATIVE EMBODIMENTS

Figure 1:
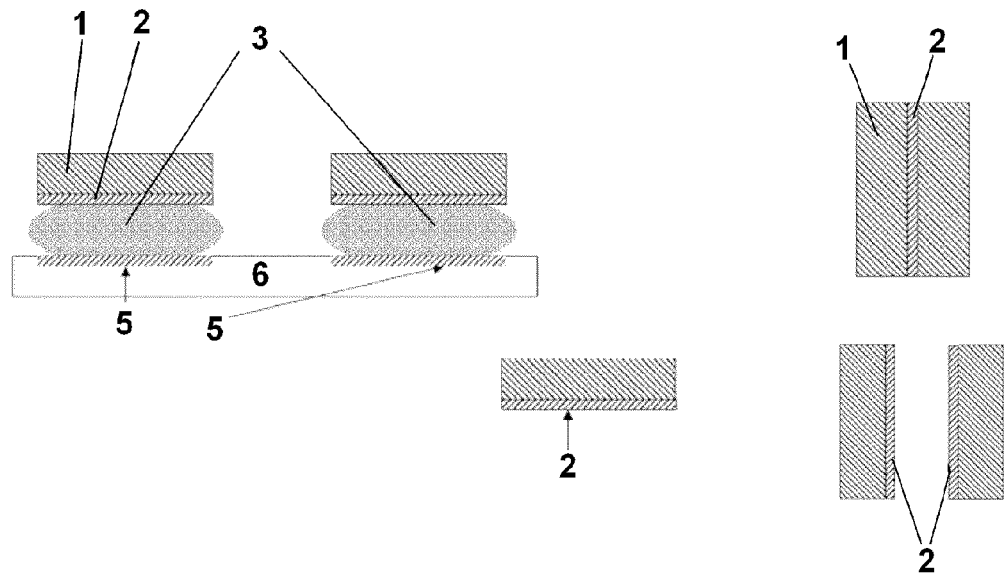
FIG. 1 illustrates chips and a method according to one embodiment.
Figure 2:
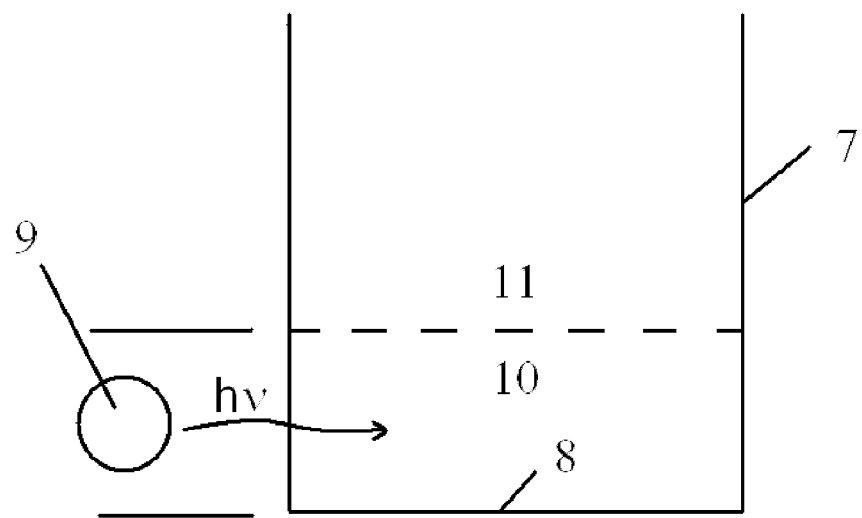
FIG. 2 illustrates a system according to one embodiment.

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the disclosure described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the disclosure described herein are capable of operation in other orientations than described or illustrated herein.

A rough measure of polarity as used in distinguishing between entities e.g. solvents and layers, which are polar or apolar (non-polar), is the dielectric constant. For example, solvents with a dielectric constant of less than 15 are generally considered apolar (non-polar). Other more specific measures of polarity are the Grunwald Winstein mY scale, which measures polarity in terms of solvent influence on buildup of positive charge of a solute during a chemical reaction, Kosower's Z scale (see Kosower, E. M. "An introduction to Physical Organic Chemistry" Wiley: New York, 1969 p. 293, which is incorporated herein by reference), which measures polarity in terms of the influence of the solvent on the UV-absorption maxima of a salt, usually pyridinium iodide or the pyridinium zwitterion, and the donor number and donor acceptor scale (see Gutmann, V. (1976). "Solvent effects on the reactivities of organometallic compounds". *Coord. Chem. Rev.* 18: 225, which is incorporated herein by reference), which measures polarity in terms of how a solvent interacts with specific substances, like a strong Lewis acid or a strong Lewis base.

In one embodiments of the first inventive aspect, a method is disclosed for positioning at least 2 chips simultaneously or in close succession on a substrate by parallel stochastic assembly in a first fluid, wherein the chips are directed to target sites on the substrate within the first fluid, the target sites being covered with a second fluid, the second fluid and the first fluid being immiscible, wherein the chips are attracting the first fluid, and on each chip a predetermined surface is chosen or treated such that it is selectively attracted by the second fluid and attracting the first fluid. By "in close succession", it is meant that two or more of the at least two chips are simultaneously present in the recipient before that one of the two or more chips contacts one of the target site.

In particular embodiments the predetermined surface starts repelling the first fluid when brought in contact with the second fluid, to which it is selectively attracted.

The first fluid and the second fluid may have a polar character and an apolar character respectively, or an apolar and a polar character respectively.

In one embodiment, the first fluid comprises water or consists substantially of water or consists of water. It may further comprise other ingredients or additives, as for instance glycerol or ethylene glycol.

The second fluid is preferably an hydrophobic fluid such as an hydrocarbon and it preferably comprises hydrocarbon oil or hydrophobic polymers. It may consist of those materials or it may comprise further ingredients.

In one embodiment in which the first fluid comprises or consists of water, the repelling and attracting properties can be understood as having a hydrophobic character and hydrophilic character respectively.

In certain embodiments the predetermined surface is a first main surface of the chips. This surface can be the surface comprising electrical interconnections, e.g. the side of the chip comprising the BEOL.

The chips can be silicon chips. They can be also of any material, given that the functional side can still be chemically-treated as described or that its surface provides the appropriate properties, and that the other sides are attracting the first fluid (e.g. hydrophilic fluid as water).

The substrate can be a silicon oxide substrate, or any substrate onto which binding sites, repelling the first fluid and selectively attracting the second, are present by previous processing steps or can be purposely patterned and are separated by areas attracting the first fluid and repelling the second. This can include for instance, substrates coated with a polymer, patterned to expose the binding sites in selected areas, and treated with e.g. oxygen plasma to improve its hydrophilicity; any oxide or oxidized substrate onto which further processing can be done to pattern binding sites (e.g. by deposition of metallic layers, or deposition of hydrophobic polymers).

In certain embodiment, the predetermined main surface of the chips comprises catenanes.

The catenanes are preferably attached to the predetermined surfaces by self assembling monolayers (SAMs). This can be performed for instance by state of the art techniques.

According to certain embodiments, the SAM's are stable at temperatures ranging from below room temperature (about 25° C.) up to below about 500° C. They can be stable within the range [room temperature, about 500° C.] or within the range [0° C., about 500° C.]. It can be stable below about 500° C., below about 400° C., below about 300° C., below about 200° C., below about 100° C., or below about 50° C., or at room temperature (about 25° C.), or below room temperature.

An alternative embodiment concern the exploitation of the wettability properties of poly(N-isopropylacrylamide) (pNIPAAM) e.g. when co-polymerized with acrylic acid. Such treatment render the microgel able to switch from hydrophobic to hydrophilic according to the pH of the local chemical environment. The microgel may be spun on the functional side of the chips so to make them able to change wetting character (from hydrophilic to hydrophobic, or vice versa) according to the change of liquid environment (from water to hydrocarbon, or vice versa).

A method according to any of the above, wherein the predetermined surface comprises a thin, first fluid-attracting layer which dissolves in the second fluid when in contact with the second fluid.

The foregoing embodiments can be used in a process wherein the target sites and first main surface of chips are patterned such that the chips are automatically oriented on the substrate. Such self-aligning and self-orienting method is driven by the minimization of interfacial energies taking place upon contact of the first main surface of chips and the second fluid coated on the binding sites. The accuracy and overall performance of such method depends on the details of geometrical matching between the 2D pattern of the binding sites and of the first main surface of the chips, on the energy associated with the fluid interface and the volume of the second fluid. Concerning the first main surface of chips, it needs not to be entirely treated in the way described above, the treatment having to be extended only to the particular area, comprising the electrical connections, which actually matches the geometrical pattern described by the target binding sites on the substrate. In the case this area does not coincide with the entire surface, the remaining part can have the same properties as the rest of the sides of the chips.

These processes may further comprise removing the substrate and the chip from the first fluid to be put in a different environment, e.g. air. They may further comprise heating the substrate, hereby causing a fine alignment of electrical contacts on the chips and substrate, and causing bonding of such electrical contacts into electrical interconnects between chip and substrate.

In one embodiment, a fluid can be a liquid. The first fluid mentioned below can be a first liquid and the second fluid mentioned below can be second liquid.

In one embodiment, the chips are made able to adapt their superficial properties according to e.g. the local chemical environment and/or the presence of physical stimuli. Indeed, the chips should be able to repel each other while completely surrounded by the aqueous hosting fluid, but at the same time they should still be able to show a selective and strong affinity towards the hydrophobic film deposited on the binding sites of the substrate.

This result can be achieved in a variety of ways. One embodiment may be the following: having the chips with their hydrophobic side covered by a thin hydrophilic layer which gets removed e.g. dissolved only when in contact with the hydrophobic coating of the sites. The chips would avoid mutual attraction when in the aqueous fluid, but still bind where required.

In another embodiment the functional side of the chips may be endowed with a proper surface chemistry whose character reversibly switch according to the local chemical environment. That is, the functional side of the chip may show a hydrophilic character when in the aqueous fluid, and a hydrophobic one when in contact with the hydrophobic fluid.

Such surface chemistry with switching properties can be provided e.g. by catenanes. The name catenanes identifies a broad class of ring-shaped macromolecules, also called macrocycles which are mechanically (not chemically) bound to each other, so to be interlocked together while still retaining some freedom of spatial movement. For the present purpose, catenanes can be involved, composed of (at least) two macrocycles, one with a hydrophilic character and the other with a hydrophobic one. Interest in catenanes and rotaxanes is recently growing because of their potential use for molecular electronics. Interestingly, it has been shown in literature that catenanes can be bound to surfaces coated with some type of self-assembling monolayers (SAMs). Certain PSA processes, such as ours, already employ SAMs to make the functional side of the chips hydrophobic. The introduction of catenanes to be linked to already-present SAMs would add, conceptually at least, only one additional processing step in the established method. This would make at the same time its integration attracting, because of its advantages, and its load on the existing process not particularly significant.

In one embodiment, the switching between an hydrophilic character and an hydrophobic character is made possible by the presence of a chemical stimulus. For instance, when at least part of a chip surface bears catenanes having at least one hydrophilic macrocycle and one hydrophobic macrocycle, the macrocycle which is not bounded to the part of the chip surface but which is mechanically linked to the macrocycle bounded to the chip surface, can expose itself in presence of a liquid having a similar polarity or hide itself in presence of a liquid having an opposite polarity. The same effect can be obtained by using catenanes composed of at least two amphiphilic macrocycles wherein the macrocycle which is not bound to the part of the chip surface but which is mechanically linked to the macrocycle bounded to the chip surface, can rotate and expose its hydrophilic part in presence of a liquid having an polar character and expose its hydrophobic part in presence of a liquid having an apolar character. Examples of catenanes usable for the performance of this embodiment are described in D. Leigh et al, Angew. Chem. Int. Ed. Engl. 1996, volume 35, No 3, page 306, which is incorporated herein by reference. For instance, the (1+1+1+1) catenane described therein can be attached to the part of the chip surface by first forming a self assembled monolayer of alkyl silane bearing polar groups (e.g. Amino or carboxylic acid) on the part of the chip surface. Then this monolayer can be functionalized by the (1+1+1+1) catenane.

In one embodiment, the switching between an hydrophilic character and an hydrophobic character is made possible by the presence of one or more physical stimulus (alone or in combination with one or more chemical stimulus).

For instance, light can be used to induce a change of polarity in the part of the chip surface. For this purpose, at least part of the chip surface is bearing photoswitchable molecules imparting to the part of the surface photocontrolled polarity. One example is the use of spiropyran. Functionalizing the at least part of the chip surface with spiropyran permits to make use of the fact that the two isomers of spiropyrans have dramatically different polarity. Attaching spiropyrans to the chip surface can be done for instance by first forming a self-assembled monolayer of alkyl chains bearing an amino group on the chip surface by reacting an aminosilane (e.g. 3-aminopropyl)triethoxysilane) on the surface. Second, a spyropyran acid chloride is grafted on the aminosilane modified chip surface. The experimental procedure to functionalize the chip surface with spyropyrans can be the same as described in Vlassiouk et al, Nano Lett. volume 6 (2006) pages 1013-1017, which is incorporated herein by reference. Once the chips are so modified, two or more of them can be positioned on a substrate positioned at the bottom of a recipient via a fluidic assembly technique while avoiding formation of chip pairs despite having at least two of the two or more chips present simultaneously in the recipient before that one of the two or more chips contacts a target site on the substrate.

Figure 3:
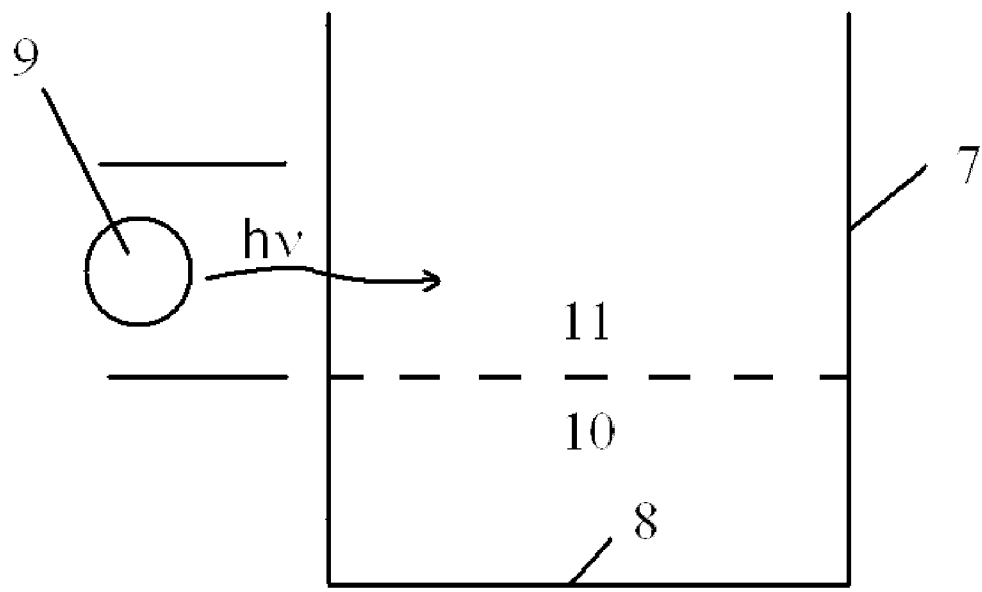
FIG. 3 illustrates another system according to one embodiment.
Figure 4:
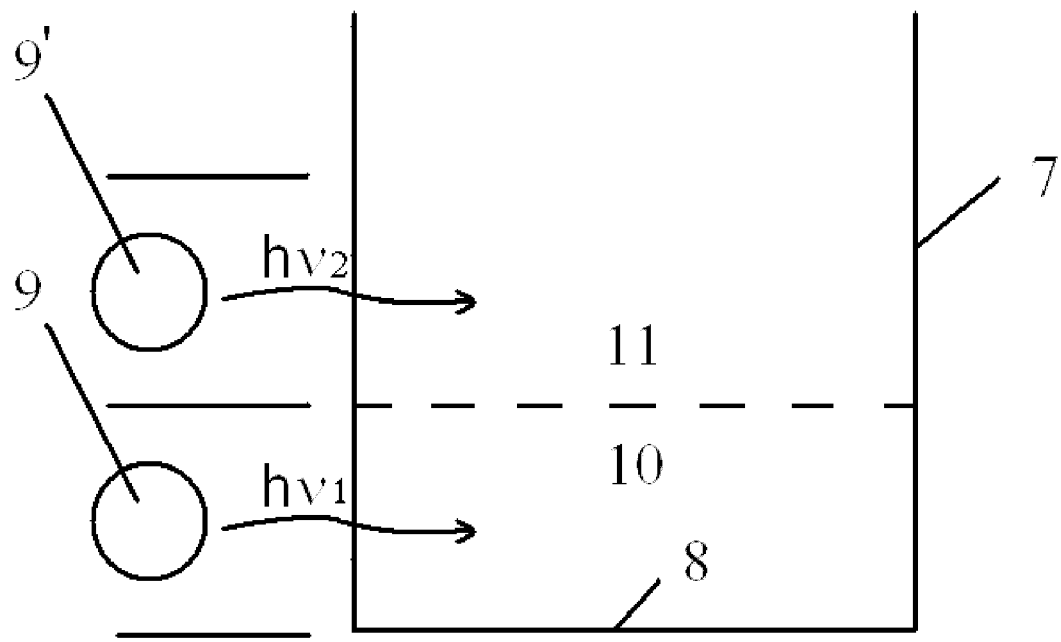
FIG. 4 illustrates yet another system according to one embodiment.

For this purpose, the recipient 7 can be made part of a system further comprising at least a first light source 9 (see FIG. 3) and optionally also a second light source 9' (see FIG. 4). The internal volume of the recipient 7 consists in two volumes: a first volume 10 and a second volume 11, the first volume 10 contacting the bottom 8 of the recipient 7 and the second volume 11 not contacting the bottom 8 of the recipient 7. The light source 9 is a UV light source 9 emitting light suitable for isomerizing spiropyran (e.g. 366 nm). The light source 9 is adapted for illuminating the second volume 11 while keeping the first volume 10 less illuminated by the light source 9 than the second volume 11 or being not illuminated by the light source 9. This can be done in various ways. For instance, the light source 9 can be positioned closer to the top of the recipient 7 than to the bottom 8 of the recipient 7. The use of a laser as a light source 9 is advantageous as it permits to efficiently focus the light beam in the second volume 11. Also possible is the use of an isotropic light source 9 which photons are directed toward the second volume 11 of the recipient 7 by using optics such as mirrors and/or lenses. Optionally, two light sources (9,9') may be used. One UV source 9' (e.g. at about 366 nm) focused on the second volume 11 of the recipient 7 and one visible light source 9 focused on the first volume 10 of the recipient 7.

When the chips 1 are in the second volume 11 of the recipient 7, due to the UV illumination, they have one of their surface 2 (e.g. the surface comprising the electrical contacts) being hydrophylic. Due to their hydrophilic nature and due to their presence in an hydrophilic medium (e.g. water) these surfaces 2 do not associate and irreversible binding of two chips is avoided. The right side of FIG. 1 shows the situation when two chips are associated (top) and when such an association is avoided (bottom). Once close to the substrate 6 present on the bottom 8 of the recipient 7, due to the absence of the UV light 9' alone or preferably due to the absence of the UV light 9' and to the presence of the visible light 9, the surface 2 comprising the electrical contacts becomes hydrophobic (closed spirocyclic isomer of spiropyran) and are now attracted to the hydrophobic liquid 3 covering the substrate binding site 5. Since the chips 1 are turned hydrophobic for a limited amount of time (for the time when the chips are in the first volume of the recipient), the probability for a pair of chips to associate irreversibly is limited as well.

An alternative to the use of grafted spiropyrans to functionalize at least part of a surface of the chips, is the use of polymers doped with spiropyrans (Athanassiou et al. Langmuir 22 (2006) 2329-2333, which is incorporated herein by reference).

Another alternative to the use of grafted spiropyrans is to use grafted azobenzene derivatives. Azobenzene photoisomerize as follow: Upon UV irradiation (e.g. about 365 nm), azobenzene is in its cis isomeric form and is hydrophilic. Upon blue light irradiation (e.g. about 436 nm), azobenzene is in its trans isomeric form and is hydrophobic. Azobenzene derivatives can be attached to the at least part of the chip surface in a similar way as for the spiropyrans. For instance, the at least part of the chip surface can be aminosilylated (formation of a SAM), then this monolayer can be functionalized with O-carboxylethylated calix[4]resorcinarene having azobenzene units (see for instance Ichimura et al, Science 288 (2000) 1624-1626, which is incorporated herein by reference). Another way to attach azobenzene to a surface such as a chip surface consists in forming first an alkyl silane monolayer containing an isocyanate group on the part of the chip surface and second covalently attaching azobenzene derivative to the isocyanate groups (see for instance Delorome et al, Langmuir volume 21 (2005) pages 12278-12282, which is incorporated herein by reference). As for the case of spiropyrans, the use of polymers comprising azobenzene moieties is also possible (see Radüge et a, Eur. Phys. J. E 10 (2003) pages 103-114, which is incorporated herein by reference). When azobenzene is used, the same systems of FIG. 3 or FIG. 4 are preferably used. Yet another alternative to the use of spiropyranes is the use of light-switchable rotaxanes as described for instance in J. Berná et al, Nature Mater. volume 4 (2005), pages 704-710, which is incorporated herein by reference. The rotaxanes described there are composed of a macrocycle having pyridine groups, the macrocycle surrounding the bar of a molecular dumbbell, the bar comprising an hydrophobic fluoroalkane portion and a more hydrophilic portion. Upon illumination with about 240-400 nm light, a nanometer displacement of the rotaxane macrocycle along the dumbbell bar leads to the shielding of the fluoroalkane units (Z-isomer of the bar) exposing a more hydrophilic portion of the bar. In order to attach such rotaxanes to the part of the chip surface, one can first form an alkyl silane monolayer having carboxylic acid groups on the part of the surface and second, grafting the rotaxanes by creating hydrogen bods between the pyridine groups from the macrocycle of the rotaxane and the carboxyl end-group of the self assembled monolayer.

Another physical stimulus that can be used is temperature. For this purpose, the at least part of the chip surface can be coated with a polymer having a lower critical solution temperature. To enhance the adherence of this coating, a SAM can be first performed on the part of the substrate with an alkyl silane bearing polar groups. For instance, poly(N-isopropylacrylamide) (NIPAM) can be used. NIPAM is hydrophilic at temperature below about 32° C. but hydrophobic at a temperatures of about 32° C. or above. By heating up the bottom of the recipient (and thereby a first volume of the recipient), to a temperature above about 32° C. (e.g. about 35° C. or 40° C.), and optionally by cooling the second volume of the recipient, one can create a temperature difference between the first volume of the recipient and the second volume of the recipient in such a way that the part of the chip surfaces are hydrophilic in the second volume of the recipient (avoiding thereby the creation of chip pairs) and hydrophobic in the first volume of the recipient (permitting thereby association with the hydrophobic target sites of the substrate).

In one embodiment, it is also possible to mix two or more kinds of stimulus, for instance a mixture of light and heat can be used to further improve the switching of polarity. For instance, azobenzene is known to have its "trans" form as its most energetically stable form. Once azobenzene has been illuminated by UV light in the second volume of the recipient (see embodiments involving azobenzene above), it can be heated in the first volume of the recipient in order to fasten its return to the hydrophobic "trans" for. This can be combined with an illumination with blue light of the first region and/or with a cooling of the second volume. In one embodiment, a suitable system can comprise a recipient and an illumination unit configured to illuminate the first volume of the recipient in a first range of wavelength and/or an illumination unit configured to illuminate with another range of wavelength the second volume of the recipient and/or a cooling unit configured to cool down one of both volumes of the recipient and/or a heating unit configured to heat up the other one of both volumes of the recipients.

Solving the problem of mutual chip adhesion does remarkably increase the overall yield of our approach to PSA. Fluid-mediated PSA could make assembly on large-scale substrate parallel, faster and cheaper than flip-chip while still complying with the same set of constraints. Indeed, interest in such techniques is rapidly growing world-wide.

The foregoing description details certain embodiments of the disclosure. It will be appreciated, however, that no matter how detailed the foregoing appears in text, the disclosure may be practiced in many ways. It should be noted that the use of particular terminology when describing certain features or aspects of the disclosure should not be taken to imply that the terminology is being re-defined herein to be restricted to including any specific characteristics of the features or aspects of the disclosure with which that terminology is associated.

While the above detailed description has shown, described, and pointed out novel features of the disclosure as applied to various embodiments, it will be understood that various omissions, substitutions, and changes in the form and details of the device or process illustrated may be made by those skilled in the technology without departing from the spirit of the disclosure. The scope of the invention is indicated by the appended claims rather than by the foregoing description. All changes which come within the meaning and range of equivalency of the claims are to be embraced within their scope.

What is claimed is:

1. A chip for use in a capillarity-driven fluidic self-assembly process comprising:
at least one external surface, wherein at least a part of the at least one external surface is capable of changing its polarity in function of the presence of one or more chemical and/or physical stimuli, wherein the at least one external surface has catenanes, the catenanes bonded to the at least one external surface, wherein a hydrophilic character is conferred by at least one hydrophilic macrocycle of the catenanes and a hydrophobic character is conferred by at least one hydrophobic macrocycle of the catenanes.

2. The chip according to claim 1, wherein the change in polarity is a switch from an hydrophilic to an hydrophobic character or from an hydrophobic to an hydrophilic character.

3. The chip according to claim 1, wherein at least one of the one or more chemical and/or physical stimuli is the polarity of a liquid media contacting the part of the at least one external surface, wherein the part of the at least one external surface is capable of switching to an hydrophilic character when in contact with an hydrophilic liquid and to a hydrophobic character when in contact with an hydrophobic liquid.

4. The chip according to claim 1, wherein at least one of the one or more chemical and/or physical stimuli is a light in a predefined wavelength range or a temperature in a predefined temperature range.

5. The chip according to claim 1, wherein the at least one external surface comprises electrical contacts configured to make interconnections with a substrate comprising corresponding contacts.

6. The chip according to claim 1, wherein the part of the at least one external surface comprises catenanes, the catenanes bonded to the at least one external surface, and wherein the hydrophilic character is conferred by at least one hydrophilic section of at least one amphiphilic macrocycle of the catenanes and wherein the hydrophobic character is conferred by at least one hydrophobic section of at least one amphiphilic macrocycle of the catenanes.

7. The chip according to claim 1, wherein the catenanes are attached to the at least one external surface by a self assembling monolayer.

8. The chip according to claim 1, wherein the catenanes are covalently attached to the at least one external surface.

9. The chip according to claim 1, wherein the part of the at least one external surface is bonded to a polymer having a lower critical solution temperature.

10. The chip according to claim 9, wherein the polymer is a N-alkylacrylamide or a N-alkylmethacrylamide polymer or copolymer.

11. The chip according to claim 10, wherein the polymer is poly(N-isopropylacrylamide).

12. The chip according to claim 1, wherein the chip is a silicon chip.

13. The chip according to claim 1, wherein the polarity change is reversible.

14. A method of positioning at least two chips on a substrate, the method comprising:
introducing at least two chips in a recipient, the recipient comprising:
a first liquid having a first polarity, and
a substrate comprising target sites having a second polarity different from the first polarity, the target sites being covered with a second liquid, the second liquid and the first liquid being immiscible, and the polarity of the second liquid being closer to the second polarity than to the first polarity, wherein the introduction is performed in such a way that two or more of the at least two chips are simultaneously present in the recipient before one of the two or more chips contacts one of the target sites.

15. The method according to claim 14, wherein the first liquid and the second liquid have a polar character and an apolar character respectively, or an apolar and polar character respectively.

16. The method according to claim 14, wherein the first liquid comprises water or consists substantially of water or consists of water.

17. The method according to claim 16, wherein the first liquid further comprises glycerol or ethylene alcohol.

18. The method according to claim 14, wherein the second liquid comprises an hydrocarbon oil an/or hydrophobic polymers.

19. The method according to claim 14, wherein the target sites comprise electrical contacts.

20. The method according to claim 14, wherein at least one target site has a size and shape which correspond to a size and shape of at least one of the introduced chips and/or has a pattern which correspond to a pattern present on at least one of the introduced chips, so as to favor a certain orientation of the at least one of the introduced chips on the at least one target site.

21. The method according to claim 14, wherein each of the chips has at least one external surface and wherein at least a part of the external surface is capable of changing its polarity in function of the presence of one or more chemical and/or physical stimuli, wherein the recipient comprises a first volume and a second volume, the first volume being closer to the substrate than the second volume, wherein one of the first volume and the second volume is illuminated with a first light for switching the polarity of a chip while the other of the first volume and the second volume is less illuminated than the one, is not illuminated with the light, or is illuminated with a second light for reversing the polarity switch caused by the first light.

22. The method according to claim 14, wherein a temperature gradient is present in the recipient so that the temperature close to the substrate is different from the temperature away from the substrate.

23. The method according to claim 14, further comprising removing the substrate and the chip from the first liquid.

24. The method according to claim 23, further comprising heating the substrate, thereby causing a fine alignment of electrical contacts on the chips and electrical contacts on the substrate, and causing bonding of such electrical contacts into electrical interconnects between the chip and the substrate.

25. A system for positioning at least two chips on a substrate, the system comprising:
   a recipient having a first volume and a second volume, the first volume being closer to the bottom of the recipient than the second volume; and
   a stimulus unit configured to impose a first physical stimulus to one of the first volume and the second volume, while the other of the first volume and the second volume is not exposed to the first stimulus, is less exposed to the first stimulus, or is exposed to a second stimulus different from the first stimulus.

26. The system according to claim 25, wherein the stimulus unit comprise a first light source configured to illuminate one of the first volume or the second volume with a first light while keeping the other less illuminated with the first light than the one, not illuminated with the first light, or illuminated with a second light different from the first light.

27. The system according to claim 25, further comprising one of more of the following:
   an illumination unit configured to illuminate the first volume of the recipient in a first range of wavelength;
   an illumination unit configured to illuminate with another range of wavelength the second volume of the recipient;
   a cooling unit configured to cool down the first volume or the second volume of the recipient; and
   a heating unit configured to heat up the second volume or the first volume of the recipient.

28. A system for positioning at least two chips on a substrate, the system comprising:
   a recipient having a first volume and a second volume, the first volume being closer to the bottom of the recipient than the second volume; and
   means for imposing a first physical stimulus to one of the first volume and the second volume, while the other of the first volume and the second volume is not exposed to the first stimulus, is less exposed to the first stimulus, or is exposed to a second stimulus different from the first stimulus.

* * * * *

UNITED STATES PATENT AND TRADEMARK OFFICE
CERTIFICATE OF CORRECTION

PATENT NO. : 8,399,986 B2
APPLICATION NO. : 13/072558
DATED : March 19, 2013
INVENTOR(S) : Mastrangeli et al.

It is certified that error appears in the above-identified patent and that said Letters Patent is hereby corrected as shown below:

On the Title Page (item 75, Inventors) at line 1, change "Vigananello (IT);" to --Vignanello (IT);--.

In the Specification

In column 9 at line 38, change "spyropyran" to --spiropyran--.

In column 9 at line 40, change "spyropyrans" to --spiropyrans--.

In column 10 at line 9, change "hydrophylic." to --hydrophilic.--.

In column 10 at line 51, change "et a," to --et al.,--.

In the Claims

In column 13 at line 17, in Claim 18, change "an/or" to --and/or--.

Signed and Sealed this
Twenty-second Day of October, 2013

Teresa Stanek Rea
*Deputy Director of the United States Patent and Trademark Office*